(12) United States Patent  
Holland et al.

(10) Patent No.: US 11,385,982 B2  
(45) Date of Patent: Jul. 12, 2022

(54) GENERAL PURPOSE INPUT/OUTPUT WITH HYSTERESIS

(71) Applicant: Apple Inc., Cupertino, CA (US)

(72) Inventors: Peter F. Holland, Los Gatos, CA (US); Hari Ganesh R. Thirunageswaram, Fremont, CA (US)

(73) Assignee: Apple Inc., Cupertino, CA (US)

( * ) Notice: Subject to any disclaimer, the term of this patent is extended or adjusted under 35 U.S.C. 154(b) by 557 days.

(21) Appl. No.: 16/401,364

(22) Filed: May 2, 2019

(65) Prior Publication Data

US 2020/0349046 A1   Nov. 5, 2020

(51) Int. Cl.
*G06F 13/40* (2006.01)
*H03K 19/0175* (2006.01)
*H03K 3/3565* (2006.01)
*G06F 11/30* (2006.01)

(52) U.S. Cl.
CPC ...... *G06F 11/3027* (2013.01); *G06F 13/4068* (2013.01); *H03K 3/3565* (2013.01); *H03K 19/017581* (2013.01)

(58) Field of Classification Search
CPC ............. G06F 11/3027; G06F 13/4068; H03K 3/3565; H03K 19/017581
USPC ........................................................... 710/8
See application file for complete search history.

(56) References Cited

U.S. PATENT DOCUMENTS

| | | | |
|---|---|---|---|
| 5,703,416 A | 12/1997 | Hinkle et al. | |
| 7,535,279 B2 | 5/2009 | Metzler | |
| 8,339,173 B2 | 12/2012 | Mehas et al. | |
| 9,590,630 B2 | 3/2017 | Xiao et al. | |
| 2016/0191057 A1* | 6/2016 | Forghani-Zadeh | H03K 19/017509 327/109 |
| 2017/0168966 A1* | 6/2017 | Mishra | G06F 13/4022 |
| 2018/0373658 A1* | 12/2018 | Shipp | G06F 15/7807 |
| 2019/0050366 A1* | 2/2019 | Mishra | G06F 13/4221 |
| 2019/0339729 A1* | 11/2019 | Bink | G05F 3/08 |
| 2019/0354152 A1* | 11/2019 | Mangano | G06F 1/24 |
| 2020/0136373 A1* | 4/2020 | Abhishek | H03K 19/018592 |
| 2020/0160990 A1* | 5/2020 | Kutzer | H05G 1/46 |
| 2020/0284830 A1* | 9/2020 | Abhishek | G01R 31/286 |
| 2021/0327239 A1* | 10/2021 | Falkenburg | G01N 33/004 |

* cited by examiner

*Primary Examiner* — Christopher B Shin
(74) *Attorney, Agent, or Firm* — Kowert, Hood, Munyon, Rankin & Goetzel, P.C; Lawrence J. Merkel

(57) ABSTRACT

In an embodiment, an integrated circuit includes one or more GPIO pins coupled to a GPIO block in the integrated circuit. At least a first GPIO pin may include corresponding logic circuitry that may be programmed to apply one or more requirements to changes of the digital value received on the first GPIO pin before the change is forwarded to a destination within the integrated circuit. That is, if the requirements are not met for a given change, the logic circuitry may suppress the given change so that it is not provided to other circuits internal to the integrated circuit (e.g. the destination circuit that receives communication via the GPIO pins). The one or more requirements may be a form of hysteresis, for example.

20 Claims, 7 Drawing Sheets

GENERAL PURPOSE INPUT/OUTPUT WITH HYSTERESIS

BACKGROUND

Technical Field

Embodiments described herein are related to general purpose input/output (GPIO) pins to an integrated circuit, and more specifically to filtering changes on the GPIO pins.

Description of the Related Art

Integrated circuits generally have pins on which signals can be provided to communicate with the integrated circuit. The signals may form a predetermined interface to the integrated circuit, such as a bus or a signal that has a specific definition, protocol, and timing associated with it. The predefined interfaces are generally well documented and understood, so that other components that will connect to the predefined interfaces can be designed to meet the specification for the predefined interfaces and then can be expected to successfully communicate with the integrated circuit.

Another type of pin that is supported by some integrated circuits is a GPIO pin. The GPIO pins are programmable to be inputs or outputs, and the definition of the information communicated over the pins can be more flexible. Typically, software or hardware within the integrated circuit can assign meaning to the communications over the GPIO pins, and that definition can be changed after manufacture of the integrated circuit by changing the programming of the GPIO pins and/or by changing how the software interprets values on the GPIO pins. In some cases, an integrated circuit can be designed for multiple products, some of which can have a particular component while others do not. The GPIO pins can be used to connect to such components, when present, and the programming of the pins allows for the communication with the particular component. The GPIO pins allow for connection to some other component if the particular component is not provided.

Like all components, components that are connected to an integrated circuit sometimes have design flaws, or "bugs." The design flaw can manifest itself as erroneous communications on the GPIO pins, which can then cause further erroneous operation within the integrated circuit. While correcting the bug in a later version of the component is typically the solution to such an issue, producing the new version requires time and the product that includes the component and the integrated circuit may be delayed until the new version is available, unless a work around for the flaw can be devised.

SUMMARY

In an embodiment, an integrated circuit includes one or more GPIO pins coupled to a GPIO block in the integrated circuit. At least a first GPIO pin may include corresponding logic circuitry that may be programmed to apply one or more requirements to changes of the digital value received on the first GPIO pin before the change is forwarded to a destination within the integrated circuit. That is, if the requirements are not met for a given change, the logic circuitry may suppress the given change so that it is not provided to other circuits internal to the integrated circuit (e.g. the destination circuit that receives communication via the GPIO pins). The one or more requirements may be a form of hysteresis, for example. In cases in which a bug in an external component causes an erroneous change in state on the GPIO pins, but the erroneous change has a predictable duration or other relationship to other communications on the GPIO pin, the hysteresis may be programmed to suppress the erroneous change, preventing the erroneous change from progressing to the internal circuitry. The hysteresis may thus provide a workaround for the bug, until corrected external components may be obtained.

BRIEF DESCRIPTION OF THE DRAWINGS

The following detailed description makes reference to the accompanying drawings, which are now briefly described.

Figure 1:
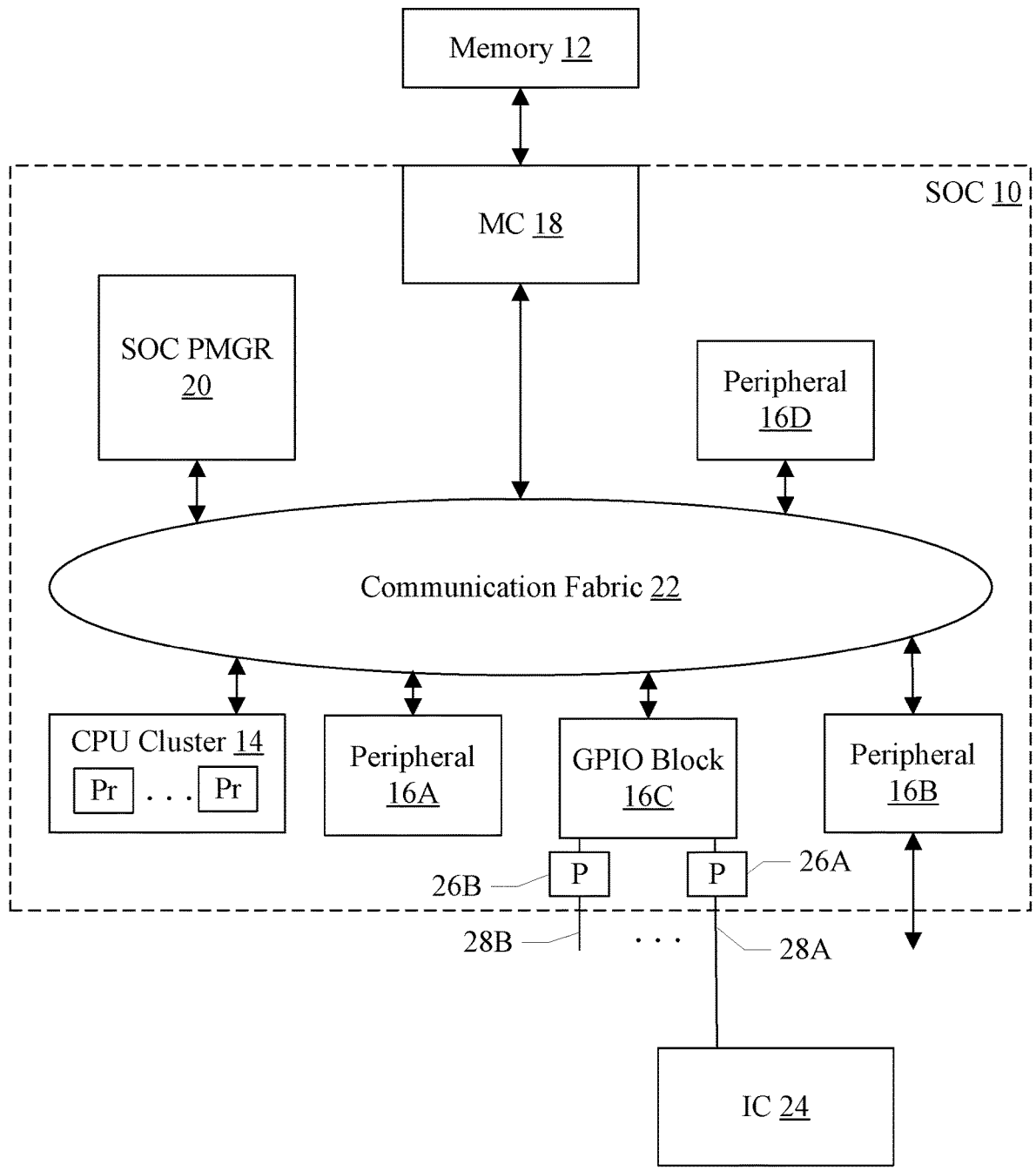
FIG. 1 is a block diagram of one embodiment of a system including a system on a chip (SOC) with general purpose input/output (GPIO) pins and an IC coupled to at least one of the GPIO pins.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean "including, but not limited to." As used herein, the terms "first," "second," etc. are used as labels for nouns that they precede, and do not imply any type of ordering (e.g., spatial, temporal, logical, etc.) unless specifically stated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be said to be "configured" to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

This specification may use the words "a" or "an" to refer to an element, or "the" to refer to the element. These words are not intended to mean that there is only one instance of the element. There may be more than one in various embodiments. Thus, "a", "an", and "the" should be interpreted to mean "one or more" unless expressly described as only one.

This specification may describe various components, units, circuits, etc. as being coupled. In some embodiments, the components, units, circuits, etc. may be coupled if they are electrically coupled (e.g. directly connected or indirectly connected through one or more other circuits) and/or communicatively coupled.

DETAILED DESCRIPTION OF EMBODIMENTS

FIG. 1 is a block diagram of one embodiment of a system on a chip (SOC) 10 coupled to a memory 12 and an external integrated circuit 24. As implied by the name, the components of the SOC 10 may be integrated onto a single semiconductor substrate as an integrated circuit "chip." In some embodiments, the components may be implemented on two or more discrete chips in a system. However, the SOC 10 will be used as an example herein. In the illustrated embodiment, the components of the SOC 10 include a processor cluster 14. The processors in the cluster 14 (Prs in FIG. 1) may be central processing units (CPUs), in an embodiment, and thus the processor cluster 14 may be a CPU cluster 14. In the illustrated embodiment, components of the SOC 10 further include peripheral components 16A-16D (more briefly, "peripherals" 16), a memory controller 18, an SOC power manager (PMGR) 20, and a communication fabric 22. The components 14, 16, 18, and 20 may all be coupled to the communication fabric 22, and thus to each other for communication between the components. The memory controller 18 may be coupled to the memory 12 during use. One of the peripherals 16C may be a GPIO block 16C, which may be coupled to various pads 26A-26B corresponding to GPIO pins 28A-28B. GPIO pin 28A may be used to communicate with the external integrated circuit 24. While the integrated circuit 24 is used as an example, generally any external component to the SOC 10 may be coupled to the SOC 10 via one or more GPIO pins 28A-28B.

The GPIO block 16C may be configured to control communication on the GPIO pins 28A-28B as programmed by the processors in the processor cluster 14. A given pin may be programmed as an input or an output, or may be switched between input and output during operation as desired. For output pins, internal circuitry within the SOC 10 may provide data to the GPIO block 16C to be driven on the output, which provides a digital output to the pads 26A-26B to be transmitted. For example, one of the peripherals 16A-16B or 16D, the SOC PMGR 20, and/or the processors in the processor cluster 14 may use an output to communicate to an external component such as the IC 24. The pads 26A-26B may include driver circuitry that drives the pin 28A-28B based on the provided data when the pin 28A-28B is programmed as an output.

For GPIOs programmed as inputs, the GPIO block 16C may receive the digital input signal from the pads 26A-26B. The pads 26A-26B may include receiver circuitry that receives signals on the pins 28A-28B. The receiver circuitry in the pads 26A-26B may convert a received analog signal (or signal treated as an analog signal, even though the signal may be driven by a digital circuit such as the IC 24) to a digital value and may provide the digital value to the GPIO block 16C. In some embodiments, the receiver circuitry may apply analog filtering to the received signal (e.g. to detect electrical glitching). However, not all erroneous communications on the input may be detected via analog filtering.

The GPIO block 16C may be configured to apply one or more requirements to a change in the digital value of a GPIO input, prior to reporting the change to the receiving circuitry in the SOC 10. The requirements may apply hysteresis to the input values, providing a form of digital filtering on the input that may go beyond the analog filtering applied by the pads 26A-26B. In the case where a bug in the external circuitry (e.g. the IC 24) is causing erroneous communication on the input, the requirements applied to the input may be used to filter out the error and allow the system to continue operating correctly.

The requirements supported by the GPIO block 16C may be various minimum requirements applied to the changes. For example, a change from one digital state to another may define an edge on the input signal (e.g. a transition from zero to one is a rising edge, and a transition from one to zero is a falling edge). The requirements may include a minimum separation between edges on the input signal. The minimum separation may be measured between edges of the same transition (e.g. minimum rising edge to rising edge separation, or minimum falling edge to falling edge separation), or may be measured between any edges (e.g. rising edge to falling edge, or vice versa). The changes in values may also be viewed as pulses. For example, a positive pulse may be defined by a rising edge and the next consecutive falling edge, and a negative pulse may be defined by a falling edge and the next consecutive rising edge. Minimum pulse widths and/or pulse separations may be applied as requirements. The various separations and widths may be measured in any units of time (e.g. clock cycles of a clock signal provided to the GPIO block 16C, units of real time or "wall clock" time), etc.

The SOC PMGR 20 may be configured to control the supply voltage magnitudes requested from the power management unit (PMU) in the system. There may be multiple supply voltages generated by the PMU for the SOC 10. For example, a voltage may be generated for the processor cores in the CPU cluster 14, and another voltage may be generated for other components in the SOC 10. In an embodiment, the other voltage may serve the memory controller 18, the peripherals 16, the SOC PMGR 20, and the other components of the SOC 10 and power gating may be employed based on power domains. There may be multiple supply voltages for the rest of the SOC 10, in some embodiments. In some embodiments, there may also be a memory supply voltage for various memory arrays in the CPU cluster 14 and/or the SOC 10. The memory supply voltage may be used with the voltage supplied to the logic circuitry, which may have a lower voltage magnitude than that required to ensure robust memory operation. The SOC PMGR 20 may be under direct software control (e.g. software may directly request the power up and/or power down of components) and/or may be configured to monitor the SOC 10 and determine when various components are to be powered up or powered down. For the CPU cluster 14, the voltage requests may be provided to the SOC PMGR 20, which may communicate the requests to the PMU to effect the change in supply voltage magnitudes.

The CPU cluster 14 generally may include one or more processor cores that act as the CPUs of the SOC 10. The CPUs may generally execute the software that controls overall operation of the system (e.g. operating system software) and various application software that provides the functionality desired in the system.

The memory controller 18 may generally include the circuitry for receiving memory operations from the other components of the SOC 10 and for accessing the memory 12 to complete the memory operations. The memory controller 18 may be configured to access any type of memory 12. For example, the memory 12 may be static random access memory (SRAM), dynamic RAM (DRAM) such as synchronous DRAM (SDRAM) including double data rate (DDR, DDR2, DDR3, DDR4, etc.) DRAM. Low power/mobile versions of the DDR DRAM may be supported (e.g. LPDDR, mDDR, etc.). The memory controller 18 may include queues for memory operations, for ordering (and potentially reordering) the operations and presenting the operations to the memory 12. The memory controller 18 may further include data buffers to store write data awaiting write to memory and read data awaiting return to the source of the memory operation. In some embodiments, the memory controller 18 may include a memory cache to store recently accessed memory data. In SOC implementations, for example, the memory cache may reduce power consumption in the SOC by avoiding reaccess of data from the memory 12 if it is expected to be accessed again soon. In some cases, the memory cache may also be referred to as a system cache, as opposed to private caches such as the shared cache or caches in the processors, which serve only certain components. Additionally, in some embodiments, a system cache need not be located within the memory controller 18.

The peripherals 16A-16D may be any set of additional hardware functionality included in the SOC 10. For example, the peripherals 16A-16D may include video peripherals such as an image signal processor configured to process image capture data from a camera or other image sensor, display controllers configured to display video data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include interface controllers for various interfaces external to the SOC 10 (e.g. the peripheral 16B) including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

The communication fabric 22 may be any communication interconnect and protocol for communicating among the components of the SOC 10. The communication fabric 22 may be bus-based, including shared bus configurations, cross bar configurations, and hierarchical buses with bridges. The communication fabric 22 may also be packet-based, and may be hierarchical with bridges, cross bar, point-to-point, or other interconnects.

It is noted that the number of components of the SOC 10 may vary from embodiment to embodiment. There may be more or fewer of each component than the number shown in FIG. 1.

Figure 2:
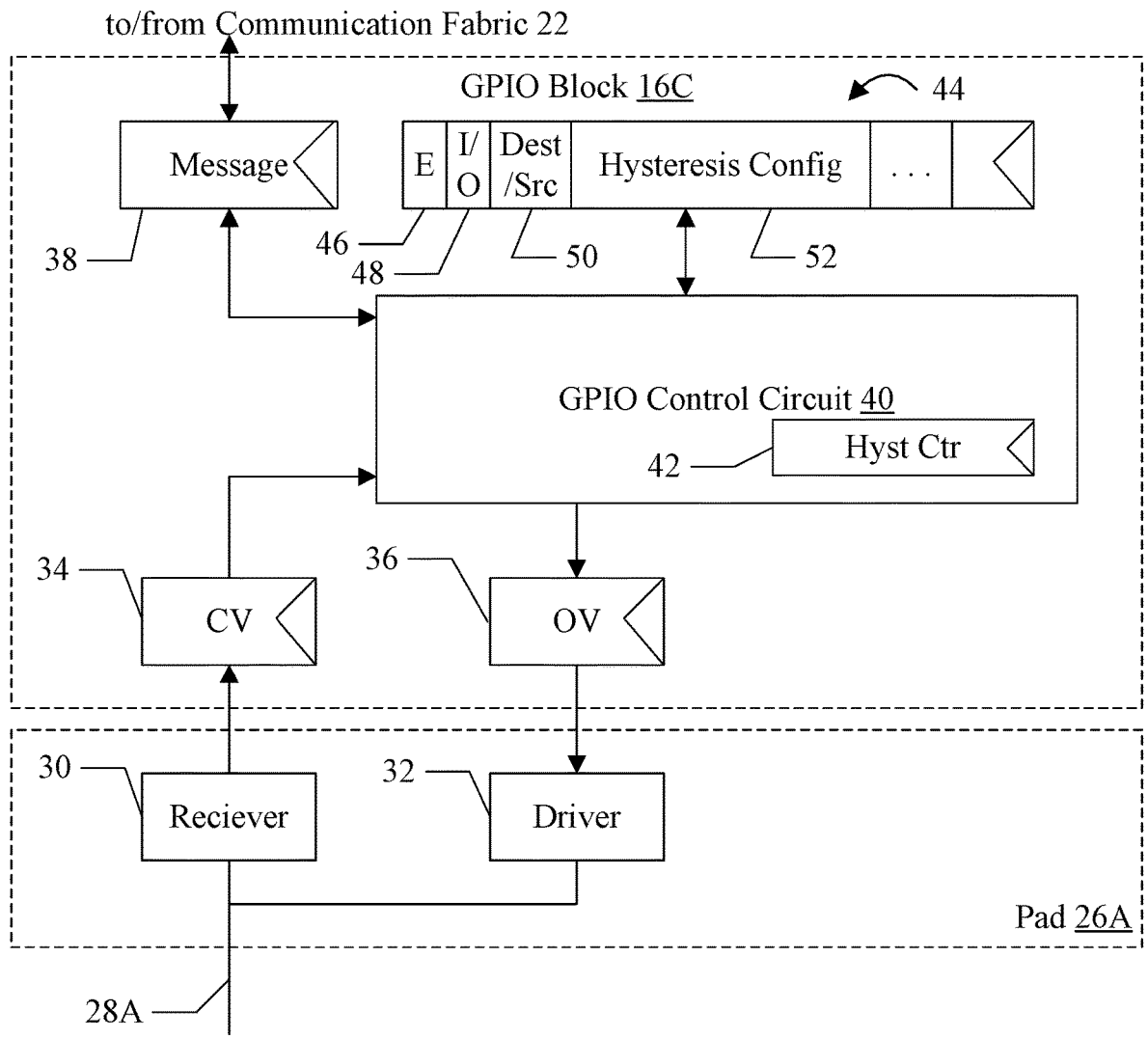
FIG. 2 is a block diagram of one embodiment of a GPIO control block shown in FIG. 1.

Turning next to FIG. 2, a block diagram of one embodiment of the GPIO block 16C and the pad 26A is shown in greater detail. In the illustrated embodiment, the pad 26A includes a receiver circuit 30 and a driver circuit 32 coupled to the pin 28A. The receiver circuit 30 is coupled to a current value (CV) flop 34 in the GPIO block 16C and the driver circuit 32 is coupled to an output value (OV) flop 36 in the GPIO block 16C. The flops 34 and 36 are coupled to a GPIO control circuit 40, which may include one or more hysteresis counters 42. The GPIO block 16C may include a message register 38 and a configuration register 44 coupled to the GPIO control circuit 40. The GPIO block 16C may include similar flops 34 and 36 and configuration register 44 for other GPIO pins such as pin 28B. The GPIO control circuit 40 may include circuitry to operation on each of the GPIO pins in parallel.

The configuration register 44 may be programmed by the processors in the processor cluster 14 to configure the pin 28A as well as any hysteresis requirements that may be invoked for the pin 28A. For example, as illustrated in FIG. 2, the configuration register 44 includes an enable (E) field 46, an input/output (I/O) field 48, a destination/source field 50, and a hysteresis configuration field 52. Other fields may be included as desired, illustrated by the ellipses in the configuration register 44 in FIG. 2.

The enable field 46 may be programmed to enable the pin 28A. For example, the enable field 46 may be a bit indicating enabled if set and disabled if clear (or vice versa), or a multibit value may be used. If the pin 28A is disabled, then it is not in use as a GPIO and the GPIO control circuit 40 may be idle for the pin 28A. If the pin 28A is enabled, the I/O field 48 may specify whether the pin 28A is an input or an output. For example, the I/O field 48 may be a bit indicative of input when set and output when clear (or vice-versa), or a multibit value may be used.

The destination/source field 50 may specify which internal component in the SOC 10 communicates via the pin 28A. More particularly, the destination/source field 50 may be an identifier that identifies the internal component on the communication fabric 22. When the pin 28A is used as output, the destination/source field 50 specifies the source component that transmits on the output. The GPIO control circuit 40 may be configured to receive a message from the communication fabric 22, via the message register 38, and compare the source identifier in the message to the source/destination field 50. If the source identifier in the message matches the source/destination field 50 and the pin 28A is configured as an output, the GPIO control circuit 40 may provide an updated output value in the output value flop 36 for the driver 32 to drive on the pin 28A. When the pin is used as an input, the destination/source field 50 specifies the destination component that receives the input. The GPIO control circuit 40 may be configured to transmit a message on the communication fabric 22 to the destination component when a change in value on the input is received (and the hysteresis requirements are met, if any). The message may identify the destination component using the value in the source/destination field 50.

The receiver circuit 30 may be configured to receive the signal on the pin 28A, and generate a corresponding digital value to be captured by the current value flop 34. The receiver 30 may include analog filtering, in some embodiments (e.g. electrical glitch filtering). The receiver 30 may further include a synchronizer to synchronize the signal to the clock on the current value flop 34 (e.g. the clock used by the GPIO block 16C), in some embodiments. A synchronizer may include, e.g., a series of two or more flops clocked by the clock signal. The synchronizer may help to ensure that no metastability occurs in capturing the signal according to the clock. In other embodiments, the synchronizer may be part of the GPIO block 16C and/or may not be included. In some embodiments, the receiver may be controlled by an enable from the GPIO block 16C, so that the receiver is idle (or "tri-stated") if the pin 28A is used as an output or is unused.

The GPIO control circuit 40 may monitor the current value flop 34 when the pin 28A is programmed as an input in the configuration register 44, and may apply hysteresis to changes in the digital value according to the hysteresis configuration field 52 in the configuration register 44, if any. That is, the hysteresis requirements may be disabled if the external component that is coupled to the pin 28A is functioning properly and not providing erroneous input that the GPIO control circuit 40 is attempting to filter using the hysteresis.

If a change in the digital value received on the pin 28A is detected by the GPIO control circuit 40, the GPIO control circuit 40 may determine if the hysteresis requirements have been met before reporting the change to the destination component. The GPIO control circuit 40 may track the hysteresis requirements via the hysteresis counters 42. For example, if the enabled hysteresis requirements include a minimum edge separation, the GPIO control circuit 40 may reset the hysteresis counter 42 when an edge is detected. When the next consecutive edge is detected (of the specified polarity, as enabled in the hysteresis requirements), the value of the hysteresis counter 42 may be compared to the minimum separation requirement to determine if the requirement is met. If the enabled requirements include a minimum pulse width, the hysteresis counters 42 may begin monitoring the pulse width when an edge that defines the beginning of a pulse is detected. If the minimum pulse width requirement is reached by the pulse without detecting the opposite edge that defines the pulse, the pulse may be passed through to the destination. If the opposite edge occurs before the minimum pulse width is reached, the GPIO control circuit 40 may filter the pulse out.

It is noted that the hysteresis requirements may be measured against the previous edge/pulse independent of whether the previous edge/pulse was filtered out due to violation of a hysteresis requirement, in one embodiment. In other embodiments, the hysteresis requirements may be measured against only those edges/pulses that were not filtered out. In still other embodiments, whether the hysteresis requirements are measured independent of the filtering or only against unfiltered edges/pulses may be a programmable feature in the hysteresis configuration filed 52.

For example, there may be a first edge/pulse, a subsequent second edge/pulse that violates a hysteresis requirement with respect to the first edge/pulse, and a third edge/pulse subsequent to the second edge/pulse. Embodiments that apply the hysteresis requirements independent of the filtered status of the edges/pulses apply the hysteresis requirements for the third edge/pulse against the second edge/pulse. Embodiments that apply the hysteresis requirements only to the edges/pulses that are not filtered out apply the hysteresis requirements for the third edge/pulse against the first edge/pulse. It is further noted that, in either case, the hysteresis requirements may be applied based on the time the events occur on the input signal (from the receiver 30), not the filtered input signal. For example, in an embodiment, pulses are delayed on the filtered input signal by the minimum pulse width (to ensure that the minimum pulse width is met prior to passing the start of the pulse to the destination). However, hysteresis requirements for a following pulse (e.g. minimum pulse separation) may be measured against the original timing of the pulse on the input signal from the receiver 30.

If the hysteresis requirements are met, the GPIO control circuit 40 may be configured to generate a message to the destination component in the SOC 10, communicating the change in the digital value to the destination component. The destination component may interpret the digital value and determine any action to be taken in response to the change in the digital value. If the hysteresis requirements are violated, the GPIO control circuit 40 may suppress the change in the digital value. That is, the change may be filtered, and thus not reported to the destination component. In some cases, the hysteresis requirement may be detected as met or violated when the change in the digital value is received (e.g. minimum edge separations). In other cases, the reporting may be delayed to ensure that hysteresis requirements are met (e.g. a minimum pulse width may be delayed until the pulse ends or the minimum pulse width is met without the pulse ending).

It is noted that the hysteresis requirements on the input may be defined orthogonally to the definition of the input at the destination component. For example, a minimum pulse width may be specified as a hysteresis requirement even if edge transitions on the input are used by the destination component. Similarly, minimum edge separations may be used even if pulses are on the input are used by the destination component.

When the pin 28A is programmed as an output in the configuration register 44, the GPIO control circuit 40 may be configured to provide an output value to the output value flop 36, which the driver circuit 32 may receive and drive on the pin 28A as discussed above. The GPIO control circuit 40 may also provide an enable, so that the driver circuit 32 drives the pins 28A responsive to the enable. If the enable is in a disabled state (because the pin 28A is being used as an input, or is unused), the driver circuit 32 may not drive the output value. That is, the driver circuit 32 may be inactive, or "tri-stated."

The flops 34 and 36, registers 38 and 44, and counters 42 may be examples of clocked storage devices. Generally, any clocked storage device may be used for the flops 34 and 26, registers 38 and 44, and counters 42. A clocked storage device may capture a value responsive to a clock, and may store the value until the next event on the clock causes another capture. Clocked storage devices may include flip-flops (flops), latches, registers, etc.

Figure 3:
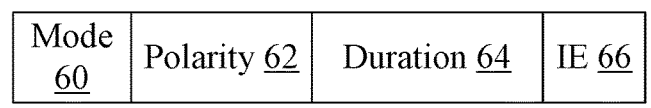
FIG. 3 is a block diagram of one embodiment of a hysteresis configuration for the GPIO block.

FIG. 3 illustrates one embodiment of the hysteresis configuration file 52. In the illustrated embodiment, the hysteresis field 52 may include a mode field 60, a polarity field 62, a duration field 64, and an interrupt enable field 66.

The mode field 60 may be an encoded enable/requirement selection field, in one embodiment. That is, one encoding of the mode field 60 may disable hysteresis, and other encodings of the field may enable hysteresis and also select which requirements are applied (e.g. which filtering is performed). For example, supported requirements may include minimum edge separation between consecutive edges in opposite directions (e.g. to opposite polarities), edge separation between consecutive edges in the same direction (e.g. to the same polarity), and minimum pulse widths for a pulse of a selected polarity. Another embodiment may also support minimum pulse separation for pulses of a selected polarity. In still other embodiments, an explicit enable field may be provided along with a field to select the desired requirements. Additionally, a bit field may be supported for selecting desired requirements, in the case that more than one requirement is desired for a given input pin. Any subset of the above hysteresis requirements, and/or additional requirements, may be supported in other embodiments.

The polarity field 62 may select the polarity of the edge/pulse that is to be filtered by the requirements. The polarity may be positive (or high, a binary one) or negative (or low, a binary zero), for example. The high polarity may specify filtering for a rising edge (binary zero to binary one) and the low priority may specify filtering for a falling edge (binary one to binary zero). In other embodiments, hysteresis requirements for both polarities may be concurrently enabled via a multi-bit polarity field. For pulses, the polarity field may define the pulse as positive (pulse from rising edge to next falling edge), negative (pulse falling edge to the next rising edge), or both if a multi-bit polarity field is used.

The duration field 64 may specify the minimum time for the selected requirements (e.g. the minimum separation or pulse width). As previously mentioned, the duration field may be measured in clock cycles of the clock provided to the GPIO block 16C. Alternatively, in other embodiments, other measures of time may be used. Additionally, for embodiments in which more than one hysteresis requirement may be concurrently enabled, there may be multiple duration fields so that different durations may be selected for different requirements.

The interrupt enable field 66 may indicate whether or not an interrupt to the processors in the processor cluster 14 is enabled when a change in the value is filtered by the hysteresis mechanism. Supporting an interrupt may permit other action to be taken by the system (besides filtering the change in value) via software executing on the processors. In other embodiments, an interrupt of the processors may not be supported, and the interrupt enable field 66 may not be included. It is noted that, in some embodiments, there may also be a register (or a field in the configuration register 44) to record filtering events. For example, the field may be a bit that may be set to indicate at least one change was filtered out. The field may be a counter that may be used to count the number of filtered changes.

Figure 4:
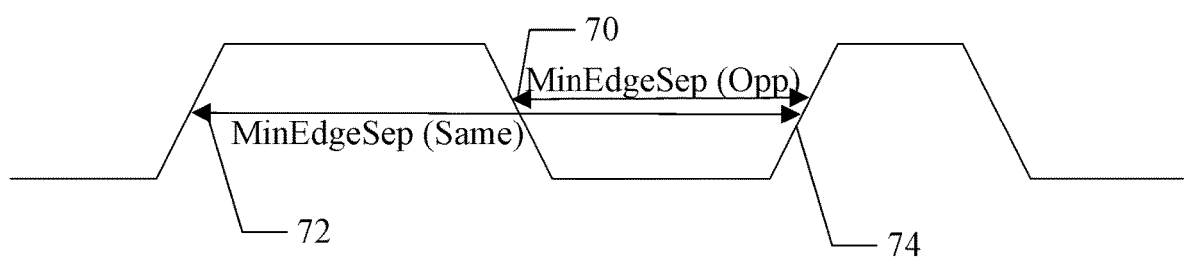
FIG. 4 is a timing diagram illustrating one embodiment of certain hysteresis configurations for an edge of a GPIO input.

FIG. 4 is a timing diagram illustrating an input signal and the minimum edge separation for a rising edge (positive polarity) on the input signal. Particularly, the minimum edge separations are illustrated for the rising edge 74 shown in FIG. 4. In the illustrated embodiment, a minimum edge separation from a previous edge of the opposite polarity (MinEdgeSep (Opp), reference numeral 70) and a minimum edge separation from a previous edge of the same polarity (MinEdgeSep (Same), reference numeral 72) is shown. In general, the minimum edge separation may be measured for consecutive edges, whether of the same polarity (rising edge or falling edge) or opposite polarity. Similar measurements may be made for a falling edge (negative polarity) if negative polarity is selected by the polarity field 62.

Figure 5:
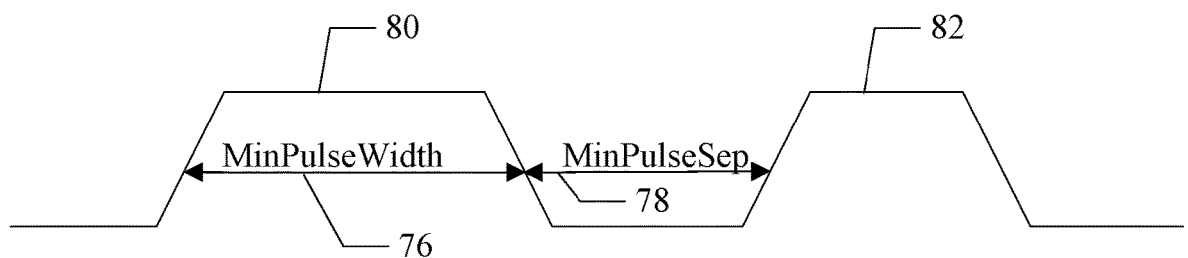
FIG. 5 is a timing diagram illustrating one embodiment of certain hysteresis configurations for a pulse of a GPIO input.

FIG. 5 is a timing diagram illustrating an input signal and the minimum pulse width (MinPulseWidth, reference numeral 76) for a positive pulse 80 or minimum pulse separation (reference numeral 78) for a positive pulse 82. Similar measurements may be made for a negative pulse as well. As can be seen in FIG. 5, the pulse width measures the amount of time that the pulse covers (edge to edge of the pulse), whereas the minimum pulse separation measures the amount of time from the end of a previous pulse to the start of the pulse.

Figure 6:
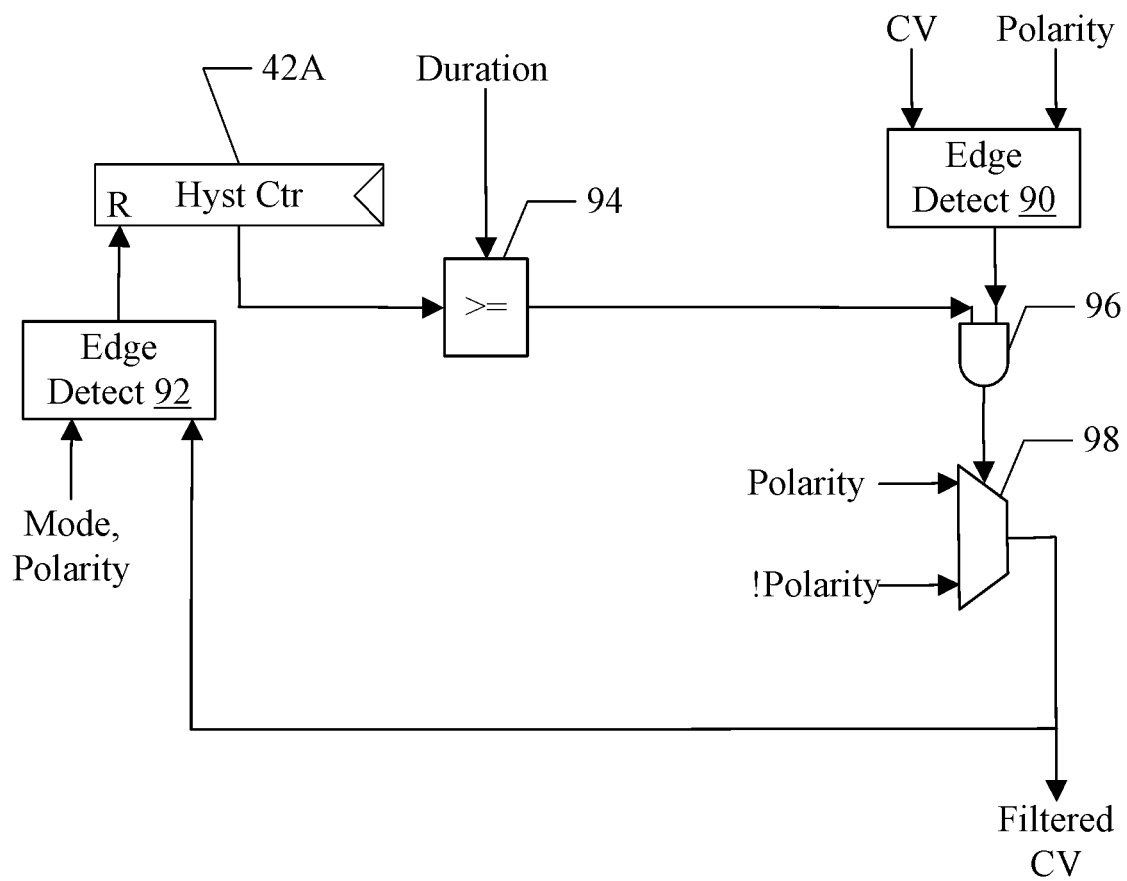
FIG. 6 is a block diagram illustrating a portion of one embodiment of the GPIO control circuit shown in FIG. 2 in greater detail.

FIG. 6 is a block diagram illustrating a portion of one embodiment of the GPIO control circuit 40 that may be used to filter edges for minimum edge separation. In the illustrated embodiment, the GPIO control circuit 40 may include edge detect circuits 90 and 92, comparator 94, one of the hysteresis counters 42 (e.g. hysteresis counter 42A), AND gate 96, and multiplexor (mux) 98. The edge detect circuit 90 has inputs coupled to the current value (CV) and the polarity field 62, and has an output coupled to an input of the AND gate 96. The other input of the AND gate 96 is coupled to the output of the comparator 94, which has inputs coupled to the duration field 64 and the hysteresis counter 42A. The output of the AND gate provides a selection control for the mux 98, which has the polarity field 62 and the logical inverse of the polarity field (!polarity) as inputs. The output is the filtered CV, subject to suppression if the edge separation requirement is not met. The filtered CV is an input to the edge detect circuit 92, which also has the mode field 60 and polarity field 62 as inputs and the output of which is coupled to a reset input on the hysteresis counter 42A.

The hysteresis counter 42A may increment on a clock cycle by clock cycle basis, unless the reset input is asserted in which case the hysteresis counter is cleared to zero. The hysteresis counter 42A may be configured to saturate at its maximum value, so if there is a long period between edges the hysteresis counter 42A may not roll over to zero and potentially filter a correctly transmitted edge. The edge detect circuit 92 may be configured to detect the prior edge from which a given edge is to be separated (e.g. the opposite edge of the selected polarity, or the same edge), as programmed in the mode field 60, and may detect the edge on the filtered CV. Thus, if the mode field 60 disables hysteresis requirements or is programmed to select only pulse requirements, the edge detect circuit 92 may not detect edges and the hysteresis counter may freely increment and saturate so that no filtering occurs. If the mode field 60 is programmed to select edge separation requirements, the edge detect circuit 92 may be configured to detect the preceding edge as specified by the mode field 60 and the polarity field 62. When the edge is detected, the edge detection circuit 92 may assert its output signal and clear the hysteresis counter 42A. The hysteresis counter 42A may begin incrementing from the cleared state, measuring the separation.

The output of the hysteresis counter 42A may be compared to the duration field 64, which specifies the minimum separation. Accordingly, if the output of the hysteresis counter 42A is greater than or equal to the duration field 64, the separation requirement has been met and the subsequent edge may not be suppressed, or filtered. Until the output of the hysteresis counter 42A meets the duration field 64, the separation requirement has not been met and the subsequent edge of the specified polarity may be suppressed, or filtered. The AND gate 96 may represent the determination. If the output of the comparator 94 is low (hysteresis count less than duration), the output of the AND gate 96 is low and the mux 98 may select the inverse of the polarity, thus filtering any edge of the designated polarity that may have been detected. If the output of the comparator 94 is high (hysteresis count greater than or equal to the duration), the output of the AND gate 96 may be determined by the edge detect circuit 90. The edge detect circuit 90 may detect the change in the CV to the desired polarity and provide a high output when the edge is detected. Thus, if the output of the comparator 94 is high and the edge detect circuit 90 detects the specified edge the output of the AND gate 96 is high and the polarity field 92 is selected as the output of the mux 98, passing the detected change in the CV through as the filtered CV and thus triggering a message to the destination component in the SOC 10.

It is noted that, while specific logic circuits are illustrated in FIG. 6, other embodiments may implement other configurations including any Boolean equivalents of the illustrated circuitry.

Figure 7:
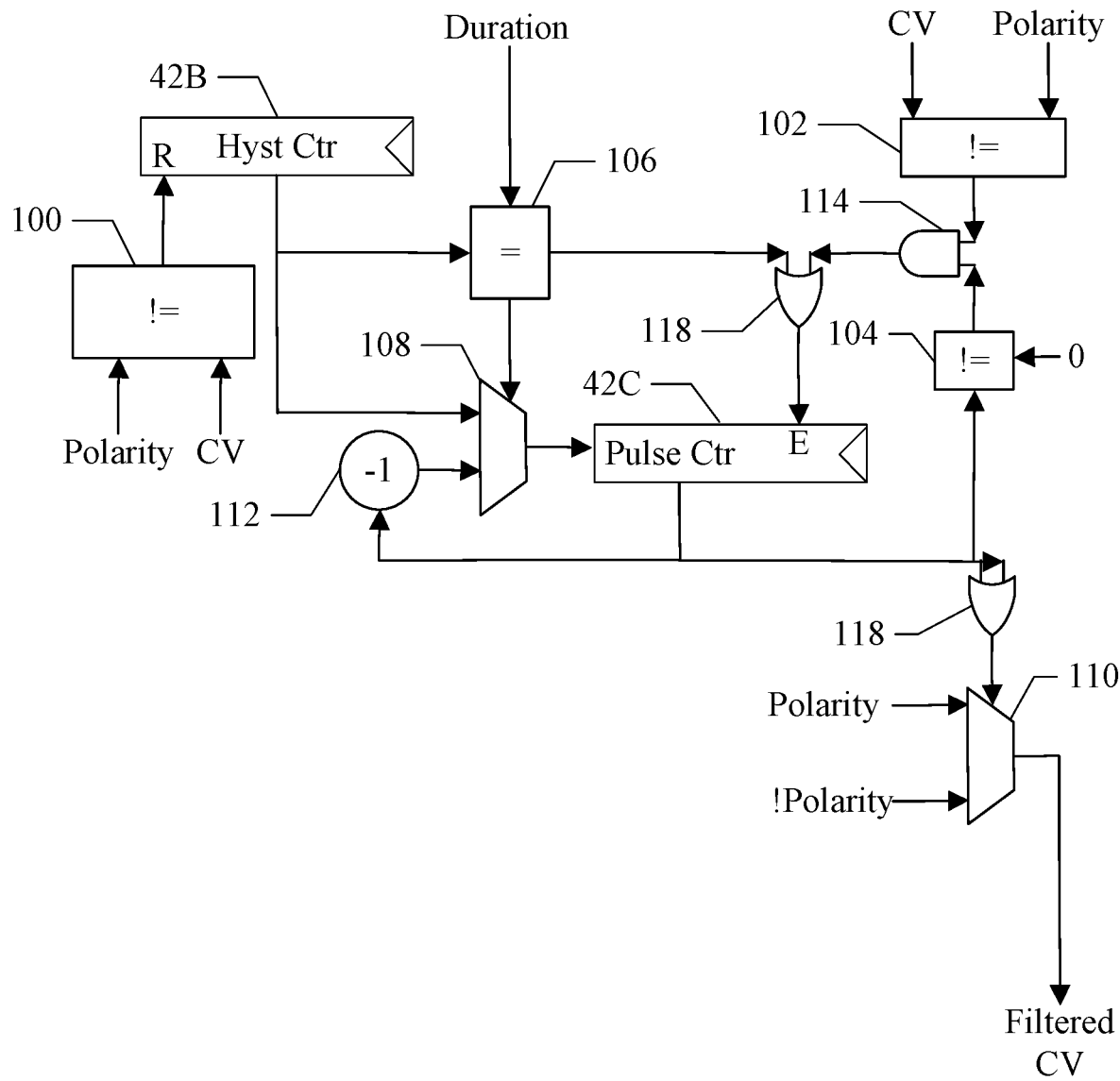
FIG. 7 is a block diagram illustrating another portion of one embodiment of the GPIO control circuit shown in FIG. 2 in greater detail.

FIG. 7 is a block diagram illustrating a portion of one embodiment of the GPIO control circuit 40 that may be used to filter pulses for minimum pulse width. The embodiment of FIG. 7 includes two hysteresis counters 42 (hysteresis counter 42B and pulse counter 42C), comparators 100, 102, 104, and 106, muxes 108 and 110, decrementor 112, AND gate 114, and OR gates 116 and 118. The comparator 100 has inputs coupled to the polarity field 62 and the CV, and an output coupled to the reset input of the counter 42B. The output of the counter 42B is coupled to an input of the comparator 106 (which also has the duration field 64 as an input) and to an input of the mux 108. The output of the decrementor 112 is coupled to an input of the mux 108. The output of the mux 108 is coupled to the input of the pulse counter 42C. The output of the comparator 106 is coupled to the selection control of the mux 108, and is coupled to an input to the OR gate 118. The other input of the OR gate 118 is coupled to the output of the AND gate 114. The output of the OR gate 118 is coupled to an enable input on the pulse counter 42C. The output of the pulse counter 42C is coupled to an input of the decrementor 112, an input of the comparator 104, and the inputs of the OR gate 118 (in a bitwise-OR configuration). The output of the OR gate 118 is a selection control on the mux 110, which selects between the polarity field 62 and the logical inverse of the polarity field 110 (!polarity). The output of the mux 110 is the filtered CV. Another input of the comparator 104 is coupled to a binary zero, and the inputs of the comparator 102 are coupled to the polarity field 62 and the CV. The outputs of the comparators 102 and 104 are coupled to inputs of the AND gate 114.

The counter 42B may increment on a clock cycle by clock cycle basis unless the reset input is asserted, similar to the operation of the counter 42A described above, saturating at its maximum value. The comparator 100 may reset the counter 42B until the CV equals the polarity field 62. Thus, the counter 42B may begin incrementing when a pulse of the specified polarity begins (polarity field 62 equals CV, and the not equal comparison of the comparator 100 is low so it does not reset the counter 42B). The counter 42B may continue incrementing until the CV does not equal the polarity field 62. Accordingly, the counter 42B may be a measure of the pulse width of a pulse of the selected polarity on the CV. If the counter 42B reaches the minimum pulse width specified by the duration field 64 without reset by a subsequent transition of the CV away from the polarity field 62, the comparator 106 output may transition high, selecting the output of the counter 42B through the mux 108 and asserting the enable on the pulse counter 42C through the OR gate 118. Thus, the pulse counter 42C is initialized to the minimum pulse width when the minimum pulse width is reached on the CV. If the CV transitions prior to the minimum pulse width being achieved, the counter 42B may be reset and the pulse counter 42C is not initialized. In this case, the pulse of less than the minimum width is suppressed (not output on the filtered CV).

Additionally, since the pulse counter 42C is non-zero when loaded with the minimum pulse width, the output of the bitwise OR gate 118 is high and the polarity field 62 is selected by the mux 110 as the filtered CV, initiating the delivery of the pulse to the destination component in the SOC 10. The comparator 106 may assert the enable for one clock cycle to load the pulse counter 42C with the minimum pulse width. Subsequently the counter 42B exceeds the duration field 84, or is reset when the pulse terminates. Accordingly, the pulse counter 42C may remain constant at the minimum pulse width until the enable is asserted again by the OR gate 118 (when the output of the AND gate 114 is asserted). That is, the pulse counter 42C may be configured to retain its current value in clock cycles in which the enable is not asserted.

The comparator 104 asserts its output when the pulse counter 42C is non-zero, and thus the corresponding input of the AND gate 114 is high. The other input of the AND gate 114 is the output of the comparator 102, which becomes high when the CV is not equal to the polarity field 62. The comparator 102 may therefore detect the end of the pulse on the CV. The output of the AND gate 114 may transition high in response, and the enable on the pulse counter 42C may be asserted again. Additionally, the counter 42B may cleared and thus the output of the comparator 106 is low. The mux 108 may select the output of the decrementor 112, which is configured to subtract one from the pulse counter 42C. In this fashion, the pulse counter 42C may decrement on a clock cycle by clock cycle basis from the minimum pulse width to zero, at which point the output of the comparator 104 may transition low. The AND gate 114 may transition low, and thus the enable input of the pulse counter 42C may transition low. The pulse counter 42C may remain constant at zero until reloaded from the counter 42B in response to the next pulse of at least the minimum pulse width.

While the pulse counter 42C is non-zero, the output of the bitwise OR gate 118 is high and the polarity field 62 continues to be output by the mux 110. Once the pulse counter 42C reaches zero, the output of the bitwise OR gate 118 transitions low and the inverse of the polarity field 62 is selected as the output of the mux 110. Accordingly, the output pulse on the filtered CV is terminated when the pulse counter 42C reaches zero. The filtered CV may have transmitted a pulse that is the same width as the input pulse, delated by a number of clock cycles equal to the duration field 64 (the minimum pulse width).

It is noted that, while specific logic circuits are illustrated in FIG. 7, other embodiments may implement other configurations including any Boolean equivalents of the illustrated circuitry.

Figure 8:
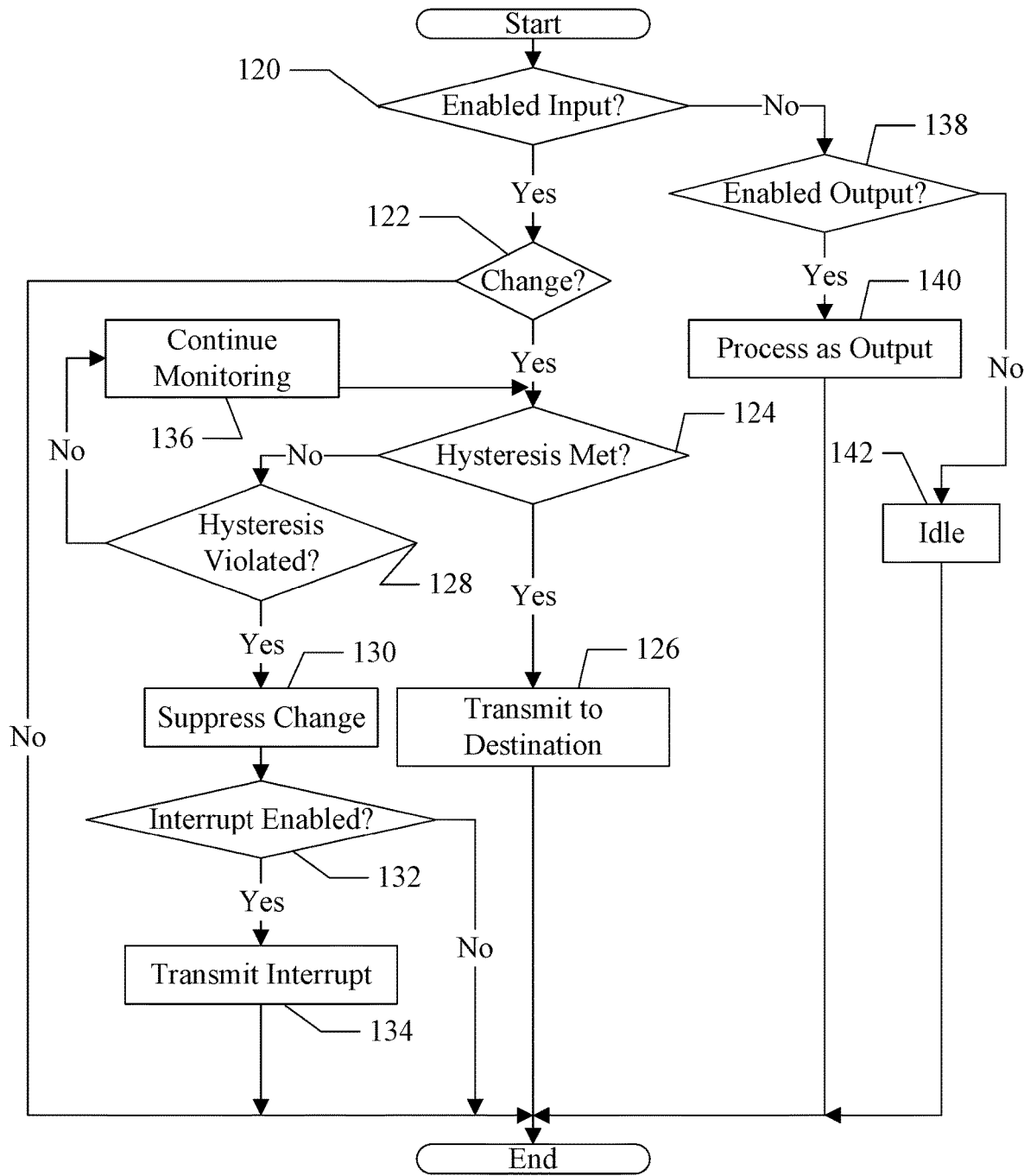
FIG. 8 is a flowchart illustrating operation of one embodiment of the GPIO control block shown in FIGS. 1 and 2.

FIG. 8 is a flowchart illustrating operation of one embodiment of the GPIO block 16C to enforce one or more hysteresis requirements on a GPIO input. FIG. 8 illustrates operation for one GPIO pin. Similar operation may be performed in parallel for each other pin controlled by the GPIO block 16C. While the blocks are shown in a particular order in FIG. 8, other orders may be used. Blocks may be performed in parallel in combinatorial logic in the GPIO block 16C. Blocks, combinations of blocks, and/or the flowchart as may be pipelined over multiple clock cycles in the GPIO block 16C. The GPIO block 16C, and more particularly the GPIO control circuit 40, may be configured to implement the operation illustrated in FIG. 8.

If the pin is enabled as an input (decision block 120, "yes" leg), the GPIO block 16C may monitor the pin for a change in the digital value (decision block 122). If there is no change (decision block 122, "no" leg), the GPIO block 16C may continue monitoring. The hysteresis counters 42 may update as appropriate. If there is a change (decision block 122, "yes" leg), and the hysteresis requirements for the input are met (decision block 124, "yes" leg), the GPIO block 16C may transmit a message to the destination component in the SOC 10, indicating the change (block 126). If the hysteresis requirements for the input are not met (decision block 124, "no" leg), the GPIO block 16C may determine if the hysteresis requirements are violated (decision block 128). In some cases, when a change is detected, it is concurrently known whether or not the hysteresis requirements are met. For example, minimum edge separations are known when an edge is detected, based on the previous edge of either the opposite polarity of the same polarity. On the other hand, the start of a pulse may be detected and whether or not the minimum pulse width has occurred may not be known. If the hysteresis requirements are violated (decision lock 128, "yes" leg), the GPIO block 16C may suppress the change (block 130). That is, the change may be filtered out and not provided to the destination component. If an interrupt is enabled for a suppressed change (decision block 132, "yes" leg), the GPIO block 16C may transmit an interrupt to the processor cluster 14 (block 134). If an interrupt is not enabled for a suppressed change (decision block 132, "no" leg), processing of the suppression may be complete. In other embodiments, an interrupt may not be supported and blocks 132 and 134 may be eliminated).

On the other hand, if it is not yet determined if the hysteresis requirements have been met (decision blocks 124 and 128, "no" legs), the GPIO block 16C may continue monitoring the input (block 136).

If the pin is not enabled as an input (decision block 120, "no" leg), but is enabled as an output (decision block 138, "yes" leg), the GPIO block 16C may process the pin as an output (block 140). That is, the GPIO block 16C update the output value in the flop 36 in responses to messages from the source component that change the value. If the pin is disabled (decision blocks 120 and 138, "no" legs), the GPIO block 16C may be idle for the pin (block 142).

Figure 9:
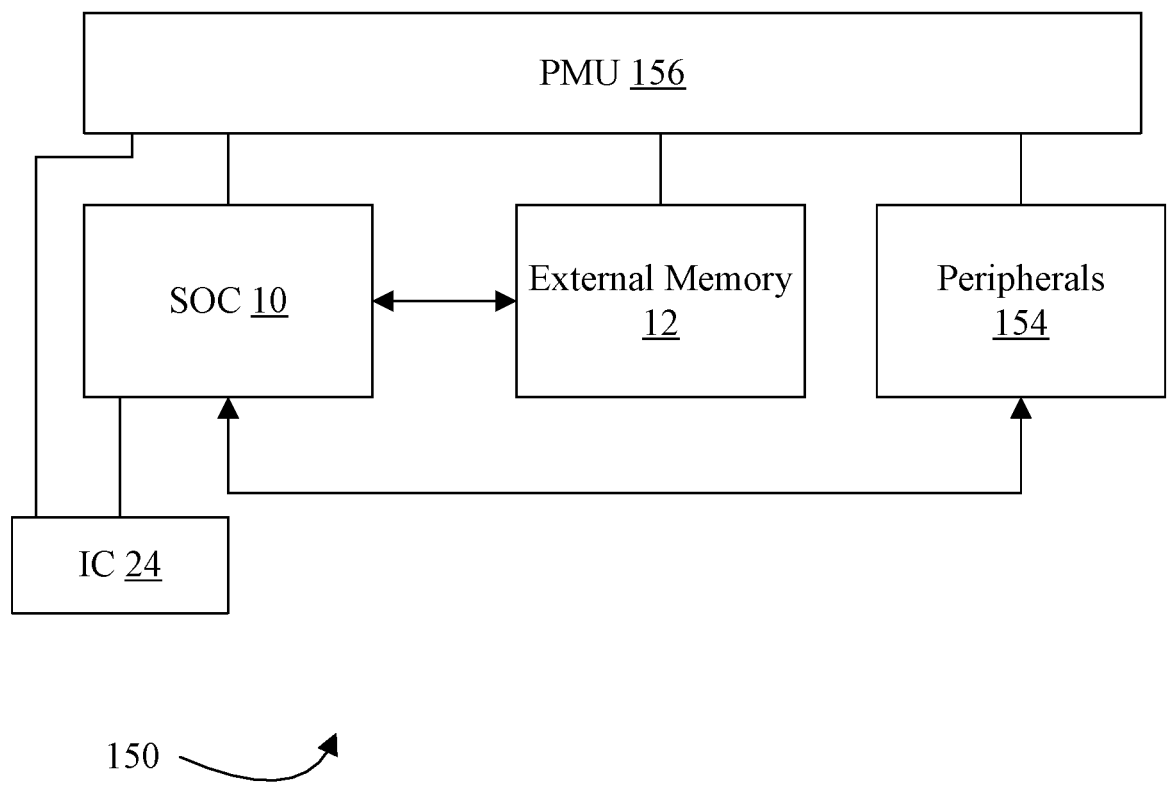
FIG. 9 is a block diagram of one embodiment of a system including the components shown in FIG. 1.

FIG. 9 is a block diagram of one embodiment of a system 150. In the illustrated embodiment, the system 150 includes at least one instance of the SOC 10 coupled to one or more peripherals 154, the IC 24, and the external memory 12. The PMU 156 is provided which supplies the supply voltages to the SOC 10 as well as one or more supply voltages to the memory 12, the IC 24, and/or the peripherals 154. In some embodiments, more than one instance of the SOC 10 may be included (and more than one memory 12 and/or IC 24 may be included as well).

The PMU 156 may generally include the circuitry to generate supply voltages and to provide those supply voltages to other components of the system such as the SOC 10, the memory 12, the IC 24, various off-chip peripheral components 154 such as display devices, image sensors, user interface devices, etc. The PMU 156 may thus include programmable voltage regulators, logic to interface to the SOC 10 and more particularly the SOC PMGR 20 to receive voltage requests, etc.

The peripherals 154 may include any desired circuitry, depending on the type of system 150. In an embodiment, the IC 24 may be an example of a peripheral 154, but is shown separately since it was shown in FIG. 1. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 12 may include any type of memory. For example, the external memory 12 may be SRAM, dynamic RAM (DRAM) such as synchronous DRAM (SDRAM), double data rate (DDR, DDR2, DDR3, etc.) SDRAM, RAMBUS DRAM, low power versions of the DDR DRAM (e.g. LPDDR, mDDR, etc.), etc. The external memory 12 may include one or more memory modules to which the memory devices are mounted, such as single inline memory modules (SIMMs), dual inline memory modules (DIMMs), etc. Alternatively, the external memory 12 may include one or more memory devices that are mounted on the SOC 10 in a chip-on-chip or package-on-package implementation.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a pin configurable as a general purpose input/output (GPIO);
   a receiver circuit coupled to the pin and configured to convert a signal on the pin to a digital value representing the signal on the pin; and
   a logic circuit coupled to the receiver circuit, wherein the logic circuit is programmable with one or more values specifying one or more requirements on a first change to the digital value, wherein the logic circuit is configured to suppress the first change in the digital value generated by the receiver circuit from being forwarded to a destination within the integrated circuit unless the one or more requirements are met by the first change in the digital value.

2. The integrated circuit as recited in claim 1 wherein an edge occurs when the digital value changes between states, and the one or more requirements comprise a minimum separation between edges.

3. The integrated circuit as recited in claim 2 wherein a first edge occurs in a change from a first state to a second state, and a second edge occurs in a change from the second state to the first state, and wherein the minimum separation applies to consecutive first and second edges.

4. The integrated circuit as recited in claim 2 wherein a first edge occurs in a change from a first state to a second state, and a second edge occurs in a change from the second state to the first state, and wherein the minimum separation applies to consecutive first edges.

5. The integrated circuit as recited in claim 2 wherein a first edge occurs in a change from a first state to a second state, and a second edge occurs in a change from the second state to the first state, and wherein the minimum separation applies to consecutive second edges.

6. The integrated circuit as recited in claim 1 wherein the one or more requirements comprise a minimum pulse width for a pulse on the digital value.

7. The integrated circuit as recited in claim 1 wherein the one or more requirements comprise a minimum separation between consecutive pulses on the digital value.

8. The integrated circuit as recited in claim 1 further comprising a configuration register coupled to the logic circuit and programmable to enable the one or more requirements.

9. The integrated circuit as recited in claim 8 further comprising a processor, wherein the configuration register is further programmable to enable an interrupt to the processor responsive to suppressing the first change because the one or more requirements are not met.

10. The integrated circuit as recited in claim 1 further comprising a second circuit, wherein the logic circuit is configured to transmit an indication of the first change to the second circuit responsive to the one or more requirements being met by the first change.

11. A method comprising:
    converting, by a receiver circuit in an integrated circuit, a signal on a pin of the integrated circuit to a digital value representing the signal;
    applying, by a logic circuit coupled to the receiver circuit, one or more requirements to changes of the digital value;
    detecting, by the logic circuit, that at least one of the one or more requirements is not met by a first change of the digital value; and
    suppressing, by the logic circuit, the first change of the digital value from propagating to a destination within the integrated circuit responsive to detecting that at least one of the one or more requirements is not met by a first change of the digital value.

12. The method as recited in claim 11 wherein an edge occurs when the digital value changes between states, and the one or more requirements comprise a minimum separation between edges.

13. The method as recited in claim 12 wherein a first edge occurs in a change from a first state to a second state, and a second edge occurs in a change from the second state to the first state, and wherein the minimum separation applies to consecutive first and second edges.

14. The method as recited in claim 12 wherein a first edge occurs in a change from a first state to a second state, and a second edge occurs in a change from the second state to the first state, and wherein the minimum separation applies to consecutive first edges.

15. The method as recited in claim 12 wherein a first edge occurs in a change from a first state to a second state, and a second edge occurs in a change from the second state to the first state, and wherein the minimum separation applies to consecutive second edges.

16. The method as recited in claim 11 wherein the one or more requirements comprise a minimum pulse width for a pulse on the signal.

17. The method as recited in claim 11 wherein the one or more requirements comprise a minimum separation between consecutive pulses on the signal.

18. The method as recited in claim 11 further comprising interrupting a processor to the processor responsive to suppressing the first change.

19. The method as recited in claim 11 further comprising:
    detecting that the one or more requirements are met for a second change of the digital value; and
    transmitting an indication of the second change to a circuit that receives the signal responsive to detecting that the one or more requirements are met by the second change.

20. A system comprising:
    a first component;

a first integrated circuit coupled to the first component via a first pin configurable as a general purpose input/output (GPIO) for the first integrated circuit, wherein the first integrated circuit is configured to generate a digital value corresponding to a signal provided by the first component on the pin, and wherein the first integrated circuit is programmable to specify one or more requirements on a first change to the digital value, wherein the first integrated circuit is configured to suppress forwarding of the first change in the digital value generated from the signal unless the one or more requirements are met by the first change in the digital value.

* * * * *